United States Patent
Kinoshita et al.

(10) Patent No.: US 7,898,877 B2
(45) Date of Patent: Mar. 1, 2011

(54) SYNCHRONOUS SEMICONDUCTOR DEVICE AND DATA PROCESSING SYSTEM INCLUDING THE SAME

(75) Inventors: Hiroto Kinoshita, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/659,521

(22) Filed: Mar. 11, 2010

(65) Prior Publication Data

US 2010/0182849 A1 Jul. 22, 2010

Related U.S. Application Data

(63) Continuation of application No. 12/216,674, filed on Jul. 9, 2008, now Pat. No. 7,715,273.

(30) Foreign Application Priority Data

Jul. 11, 2007 (JP) ................................. 2007-182575

(51) Int. Cl.
*G11C 7/10* (2006.01)
(52) U.S. Cl. ................ 365/189.05; 365/191; 365/230.08
(58) Field of Classification Search ............. 365/189.05, 365/233.1, 230.06, 230.08, 191, 194
See application file for complete search history.

(56) References Cited

U.S. PATENT DOCUMENTS

| | | | |
|---|---|---|---|
| 5,793,688 A | 8/1998 | McLaury | |
| 5,801,554 A * | 9/1998 | Momma et al. | 327/89 |
| 5,813,023 A | 9/1998 | McLaury | |
| 5,880,998 A | 3/1999 | Tanimura et al. | |
| 6,452,866 B2 | 9/2002 | McLaury | |
| 6,496,403 B2 * | 12/2002 | Noda et al. | 365/63 |
| 6,512,719 B2 * | 1/2003 | Fujisawa et al. | 365/233.1 |
| 6,647,465 B2 | 11/2003 | Kametani et al. | |
| 7,715,273 B2 * | 5/2010 | Kinoshita et al. | 365/233.1 |

FOREIGN PATENT DOCUMENTS

| | | |
|---|---|---|
| JP | 7-230688 | 8/1995 |
| JP | 11-16349 | 1/1999 |
| JP | 2007-12128 | 1/2007 |

* cited by examiner

*Primary Examiner* — Gene N Auduong
(74) *Attorney, Agent, or Firm* — McGinn IP Law Group, PLLC (57) ABSTRACT

A semiconductor device includes first, second and third terminals respectively receiving first, second and third input signals from outside, first, second and third input buffers respectively coupled to the first, second and third terminals, the first, second and third input buffers producing first, second and third buffered signals responsive to the first, second and third input signals, respectively, and first and second gate circuits respectively coupled to the first and second input buffers, the first and second gate circuits coupled to the third input buffer in common, the first and second gate circuits respectively driving output nodes thereof in response to the first and second buffered signals when the third buffered signal is activated, and each of the first and second gate circuits holding the output nodes thereof at a fixed level irrelatively to the first and second buffered signals when the third buffered signal is inactivated.

20 Claims, 8 Drawing Sheets

SYNCHRONOUS SEMICONDUCTOR DEVICE AND DATA PROCESSING SYSTEM INCLUDING THE SAME

The present application is a Continuation of U.S. application Ser. No. 12/216,674, filed on Jul. 9, 2008 now U.S. Pat. No. 7,715,273, and which claims priority from Japanese Patent Application No. 2007-182575, filed on Jul. 11, 2007, the entire contents of which are incorporated herein by reference.

TECHNICAL FIELD

The present invention relates to a synchronous semiconductor device that operates in synchronism with a clock signal, and, more particularly relates to an input circuit that fetches an address signal or a command signal. The present invention also relates to a data processing system having such a synchronous semiconductor device.

BACKGROUND OF THE INVENTION

Most of semiconductor devices such as a DRAM (Dynamic Random Access Memory) or the like are of a type which operates in synchronism with a clock signal. In such a synchronous semiconductor device, when a frequency of the clock signal rises, consumed power of an input circuit that fetches an address signal or a command signal increases, and therefore various kinds of propositions for reducing the consumed power of the input circuit at a time of being inactive have been made (see Japanese Patent Application Laid-open Nos. H7-230688, H11-16349, and 2007-12128).

For example, Japanese Patent Application Laid-open No. H7-230688 describes a method in which in response to a chip select signal being inactive, an operation of an input buffer that receives the address signal or the command signal is stopped. More specifically, when the chip select signal is inactivated, a bias current of a differential amplifier circuit configuring the input buffer is cut, and the consumed power thereby is reduced. However, when the bias current of the differential amplifier circuit is cut, a predetermined time is necessary to make the differential amplifier circuit operable again, and therefore, when the frequency of the clock signal is particularly high, adopting such a method is difficult.

Meanwhile, Japanese Patent Application Laid-open No. H11-16349 describes a method in which in response to a chip select signal being inactive, a supply itself of a clock signal for an internal circuit is stopped. However, when an internal clock signal is stopped, restoring the internal circuit takes time, and therefore, it is thought to be inappropriate to stop the clock signal itself in sequence with the chip select signal.

Further, Japanese Patent Application Laid-open No. 2007-12128 describes a method in which in response to a chip select signal being inactive, a clock signal supply to a latch circuit that latches an address signal or the like is stopped. However, between an input buffer and the latch circuit, there exist various kinds of circuits, such as a delay circuit, which adjust a timing. Therefore, even when an operation of the latch circuit is stopped, a charge/discharge current generated from an operation of the delay circuit or the like cannot be reduced.

SUMMARY OF THE INVENTION

It is therefore an object of the present invention to provide an improved synchronous semiconductor device capable of reducing consumed power of an input circuit unit in response to a chip select signal being inactive.

Another object of the present invention is to provide a synchronous semiconductor device capable of reducing consumed power without stopping an operation of an input buffer or an internal clock signal, in response to a chip select signal being inactive.

Still another object of the present invention is to provide a synchronous semiconductor device capable of reducing consumed power generated between an input buffer and a latch circuit, in response to a chip select signal being inactive.

Still another object of the present invention is to provide a synchronous semiconductor device capable of reducing a charge/discharge current of a delay circuit used for a timing adjustment of an address signal, a command signal or the like in response to a chip select signal being inactive.

The above and other objects of the present invention can be accomplished by a synchronous semiconductor device that operates in synchronism with an external clock signal, comprising:

a plurality of input buffers that receive external input signals and the external clock signal to generate internal input signals and an internal clock signal, respectively;

a latch-signal generating circuit that generates a latch signal based on the internal clock signal;

a plurality of latch circuits that latch the internal input signals or decoded signals thereof in response to the latch signal;

a plurality of delay circuits that supply the latch circuits with the internal input signals or the decoded signals thereof in synchronism with the latch signal; and a plurality of gate circuits that inactivate the internal input signals or the decoded signals thereof in response to a chip select signal being inactive, the gate circuits being arranged between the input buffers and the delay circuits.

A data processing system according to the present invention includes a data processor and said synchronous semiconductor device.

An external input signal and an internal input signal can be an address signal or a command signal. In the former, a latch circuit can latch the address signal, and in the latter, the latch circuit can latch a decoding result of the command signal.

As described above, according to the present invention, a gate circuit that causes the internal input signal or a decode signal thereof to become inactive in response to a chip select signal becoming inactive is arranged at a previous stage of a delay circuit having a large charge/discharge current. Accordingly, without stopping an operation of an input buffer or an internal clock signal, consumed power generated between the input buffer and the latch circuit can be effectively reduced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
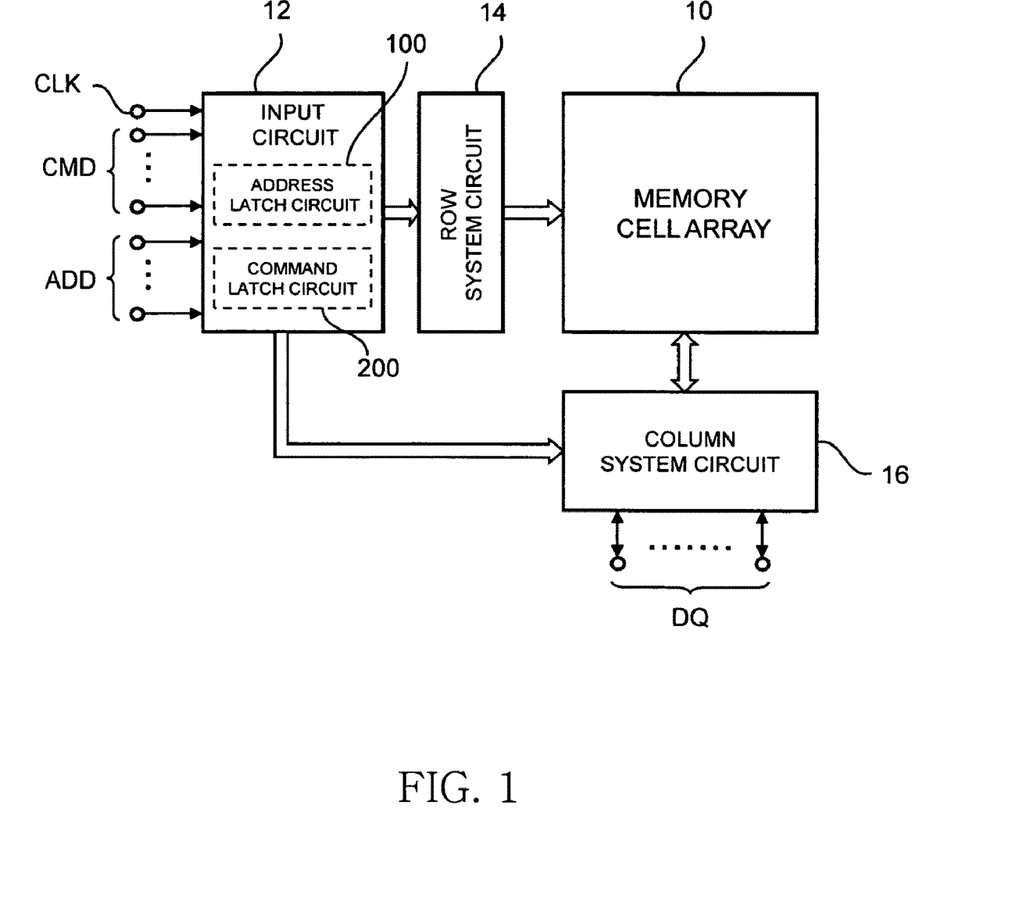
FIG. 1 is a block diagram showing a configuration of a synchronous semiconductor device according to a preferred embodiment of the present invention.

FIG. 1 is a block diagram showing a configuration of a synchronous semiconductor device according to a preferred embodiment of the present invention.

The synchronous semiconductor device according to the present embodiment is a synchronous DRAM, and includes a memory cell array 10, an input circuit 12 that receives various external input signals, and a row system circuit 14 and a column system circuit 16, each of the circuits which executes a row system access for the memory cell array 10 and a column system access therefor, as shown in FIG. 1.

When reading data from the memory cell array 10, a read command is issued via a command terminal CMD, and an address signal to be read is supplied via an address terminal ADD. Thereby, the data read from the memory cell array 10 is outputted via a data input/output terminal DQ. On the other hand, when writing data in the memory cell array 10, a write command is issued via the command terminal CMD, and the address signal to be written is supplied via the address terminal ADD, and the data to be written is inputted to the data input/output terminal DQ. Thereby, the inputted data is written in the memory cell array 10.

As shown in FIG. 1, the input circuit 12 includes an address latch circuit 100 and a command latch circuit 200. The address latch circuit 100 latches an address signal inputted in synchronism with an external clock signal. The command latch circuit 200 decodes a command signal inputted in synchronism with the external clock signal, and latches a decoding result thereof (an internal command). An internal address latched to the address latch circuit 100 and an internal command latched to the command latch circuit 200 are supplied to the row system circuit 14 and the column system circuit 16. The row system circuit 14 and the column system circuit 16 perform a predetermined operation in response to the supplied internal address and internal command. Since a configuration and an operation of the row system circuit 14 and the column system circuit 16 are not directly related to a gist of the present invention, explanations thereof will be omitted.

Figure 2:
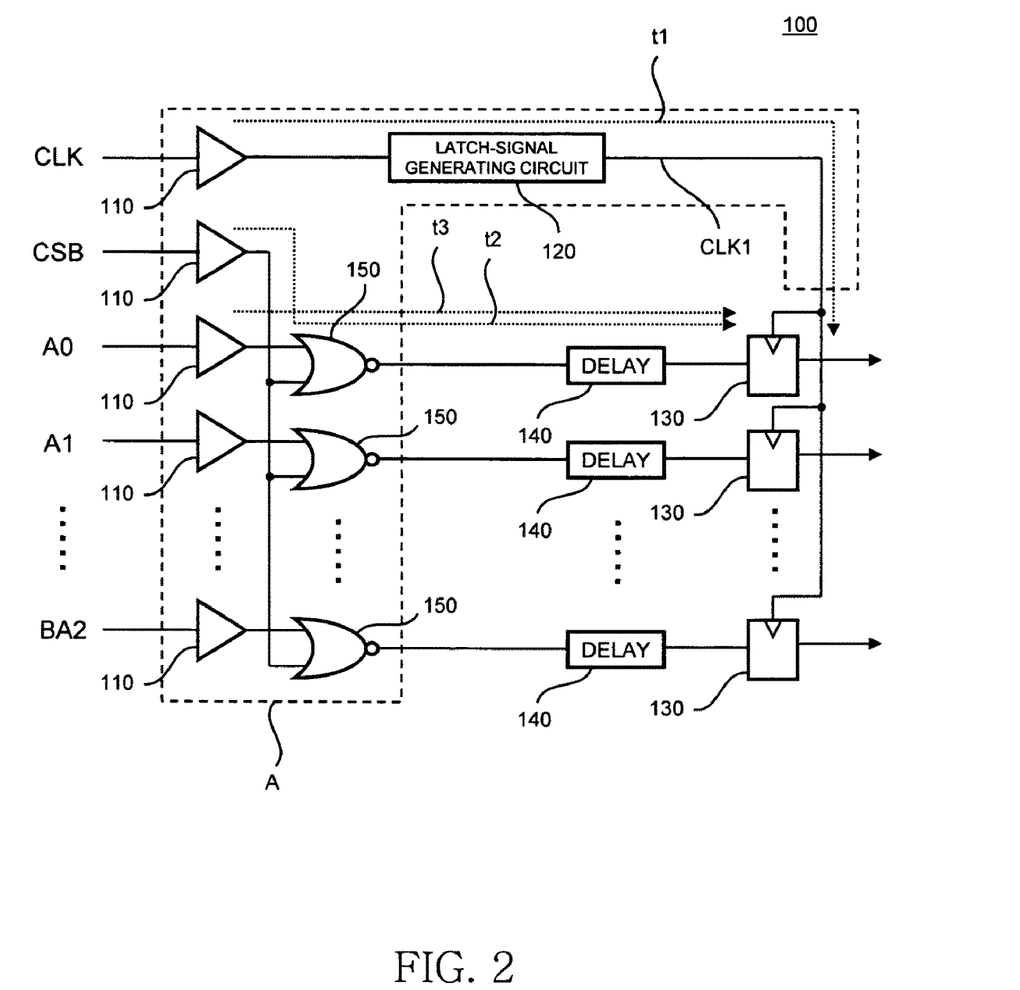
FIG. 2 is a circuit diagram showing one example of the address latch circuit included in the input circuit shown in FIG. 1.

FIG. 2 is a circuit diagram showing one example of the address latch circuit 100 included in the input circuit 12.

As shown in FIG. 2, the address latch circuit 100 has a plurality of input buffers 110 that receive: a clock signal CLK; address signals A0 to BA2; and a chip select signal CSB. The address signals A0 to BA2 are signals inputted via the address terminal ADD shown in FIG. 1. The chip select signal CSB is one of the signals inputted via the command terminal CMD shown in FIG. 1. These signals are so distinguished that those before a state of being supplied to the input buffers 110 are external signals; and those in a state of passing through the input buffers 110 are internal signals. For example, a clock signal before being supplied to the input buffers 110 is called an external clock signal, and that which passes through the input buffers 110 is called an internal clock signal. Note that, as a general rule, like reference numerals are given to the corresponding external signals and internal signals.

The address latch circuit 100 further has: a latch-signal generating circuit 120 that generates a latch signal CLK1 based on the internal clock signal CLK generated by the input buffer 110; and a plurality of latch circuits 130 that latch an internal address signal generated by the input buffer 110.

The latch circuits 130 each latch the corresponding internal address signal in response to the latch signal CLK1. Thus, until the latch circuits 130 perform a latch operation after the internal clock signal CLK becomes active, there is a signal transmission time t1 that includes a delay by the latch-signal generating circuit 120. Accordingly, when the internal address signal is supplied as such to the latch circuit 130, a supply timing of the internal address signal is too early for the latch signal CLK1. To cancel such a timing difference, at a prior stage of the latch circuits 130, a plurality of delay circuits 140 are arranged.

Further, the address latch circuit 100 further has a plurality of NOR gate circuits 150 arranged between the input buffers 110 and the delay circuits 140. As shown in FIG. 2, in the NOR gate circuits 150, one input terminals thereof are each supplied with the corresponding internal address signals, and the other input terminals thereof are commonly supplied with the chip select signal CSB. The chip select signal CSB is a low-active signal, and when this becomes a high level, a whole chip becomes a non-selective state.

A signal transmission time t2, which results from the chip select signal CSB passing through the NOR gate circuit 150 and the delay circuit 140, is set substantially equal to the signal transmission time t1. Likewise, a signal transmission time t3, which results from the address signal passing through the NOR gate circuits 150 and the delay circuits 140, is set substantially equal to the signal transmission time t1. That is, when setting to t1=t2=t3 is established, in synchronism with the latch signal CLK1, the internal address signal is correctly supplied to the latch circuits 130.

In the address latch circuit 100, such a chip select signal CSB is commonly supplied to the NOR gate circuits 150, and therefore, when the chip select signal. CSB becomes a high level (inactive), all outputs of the NOR gate circuits 150 are fixed to a low level. Thereby, a section where a charge and a discharge occur resulting from a change of the external signal is limited to a section A shown in FIG. 2. Further, charge/discharge currents resulting from the change of the external signal occur especially often in the delay circuits 140, and therefore, when a signal logic in this section is fixed, the consumed power can be reduced effectively.

In addition, even when the chip select signal CSB becomes inactive, operations of the input buffers 110 and the internal clock signal CLK are not stopped. Thereby, when the chip select signal CSB is changed to active, the operations can be restarted immediately.

Figure 3:
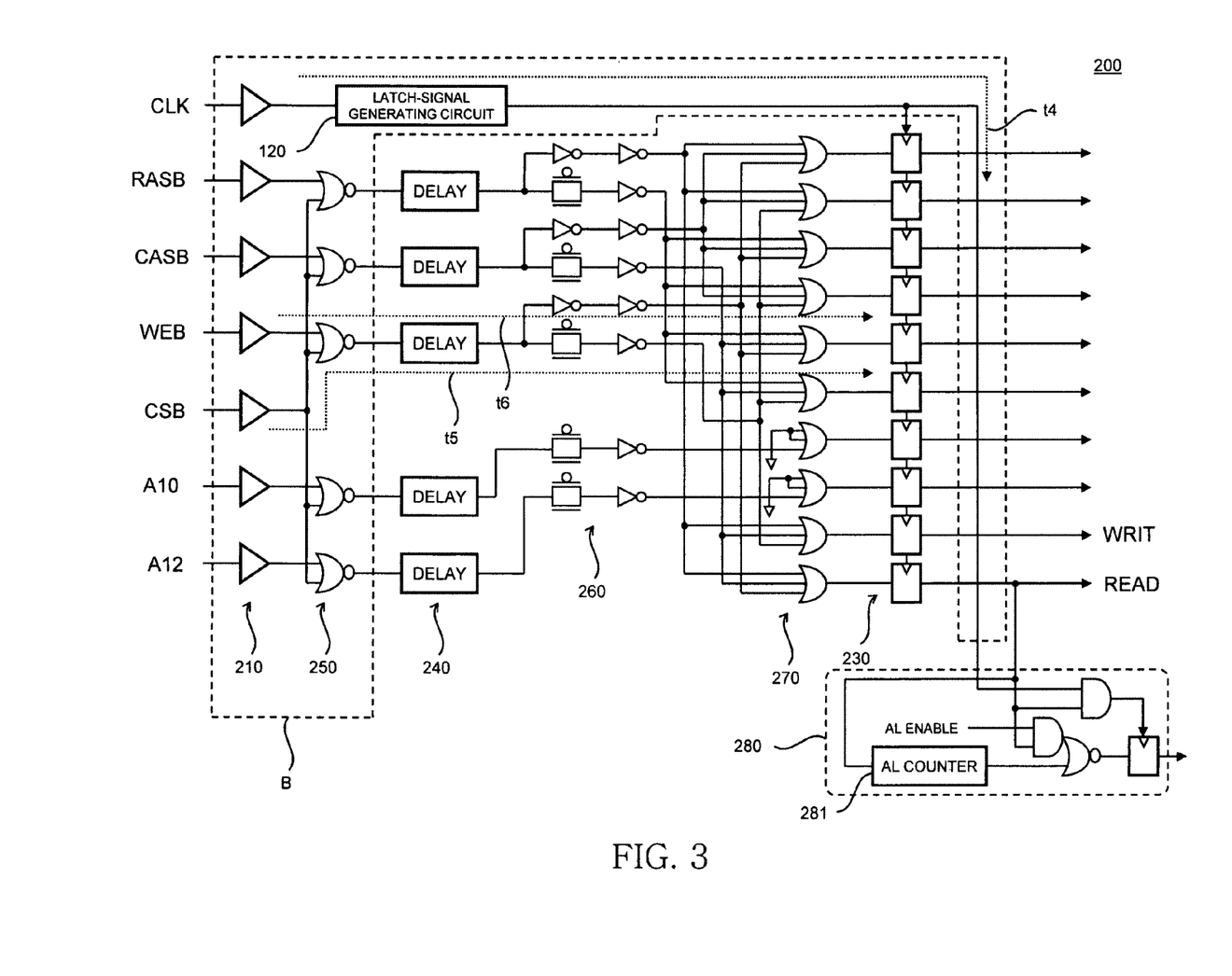
FIG. 3 is a circuit diagram showing one example of the command latch circuit included in the input circuit shown in FIG. 1.

FIG. 3 is a circuit diagram showing one example of the command latch circuit 200 included in the input circuit 12.

As shown in FIG. 3, the command latch circuit 200 has a plurality of input buffers 210 that receive the clock signal CLK, command signals RASB, CASB, WEB, and CSB, and the address signals A10 and A12. The input buffer 210 that receives the clock signal CLK, the chip select signal CSB, and the address signals A10 and A12 can be used in common with the input buffers 110 shown in FIG. 2.

The command signals RASB, CASB, WEB, and CSB are signals inputted via the command terminal CMD shown in FIG. 1. These command signals also are so distinguished that those before a state of being supplied to the input buffer 210 are external signals; and those in a state of passing through the input buffer 210 are internal signals. As a general rule, the external signals and the internal signals are given like reference numerals.

Similarly to the address latch circuit 100, the command latch circuit 200 includes a plurality of delay circuits 240 and a plurality of NOR gate circuits 250 arranged between the input buffers 210 and the delay circuits 240. As shown in FIG. 3, in the NOR gate circuits 250, one input terminals thereof are respectively supplied with the corresponding internal command signals RASB, CASB, and WEB, and the address signals A10 and A12, and the other input terminals are supplied commonly with the chip select signal CSB. Therefore, when the chip select signal CSB becomes a high level (inactive), all outputs of the NOR gate circuits 250 are fixed to a low level.

At a later stage of the delay circuits 240, complementary-signal generating units 260 that generate a complementary signal are arranged. The complementary-signal generating units 260 generate complementary signals of the row-address strobe signal RASB, the column-address strobe signal CASB, and the write enable signal WEB, and adjusts timings of the address signals A10 and A12 so that the timings of these signals and the complementary signals are not deviated. Accordingly, a total number of output signals from the complementary-signal generating units 260 is 10.

At a later stage of the complementary-signal generating units 260, a plurality of decoder circuits 270 are arranged. Each decoder circuit 270 is configured by 3-input OR gate circuits. More specifically, each decoder circuit 270 is configured by: 8 (=2.sup.3) decoder circuits 270 that decode the three command signals RASB, CASB, and WEB; and a total of ten decoder circuits 270 formed of two decoder circuits 270 each replying only to the address signals A10 and A12.

Decode signals or outputs of the decoder circuits 270 are each supplied to the corresponding latch circuits 230. The latch circuits 230 latch the corresponding decode signal in response to the latch signal CLK1. The latch-signal generating circuit 120 that generates the latch signal CLK1 can be used in common with the input buffers 110 shown in FIG. 2.

The latch circuits 230 include ten latch circuits that receive results of the decode of each of the corresponding decoder circuits 270. Furthermore, when an additive latency (AL) is a minimum of 1, an additional latency circuit 280 that outputs a read command after an elapse of an additive latency set to an AL counter 281 is arranged, and one latch circuit 230 is arranged in the additional latency circuit 280. Although not shown, also an additional latency circuit 280 for a write command is arranged, and therefore a total of 12 latch circuits 230 are used.

Also in the command latch circuit 200, a signal transmission time t5 resulting from the chip select signal CSB passing through the NOR gate circuits 250, the delay circuit 240, the complementary-signal generating unit 260, and the decoder circuit 270 is set substantially equal to a signal transmission time t4 of the internal clock signal. Likewise, a signal transmission time t6 resulting from the command signal passing through the NOR gate circuits 250, the delay circuit 240, the complementary-signal generation unit 260, and the decoder circuit 270 is set substantially equal to the signal transmission time t4. That is, when setting to t4=t5=t6 is established, in synchronism with the latch signal CLK1, the decode signal is correctly supplied to the latch circuit 230.

In the command latch circuit 200, such a chip select signal CSB is commonly supplied to the NOR gate circuits 250, and therefore, when the chip select signal CSB becomes a high level (inactive), all outputs of the NOR gate circuits 250 are fixed to a low level. Thereby, a section where a charge and a discharge occur resulting from a change of the external signal is limited to a section B shown in FIG. 3. Therefore, similarly to the address latch circuit 100, the consumed power at a time of being inactive can be effectively reduced.

Figure 4:
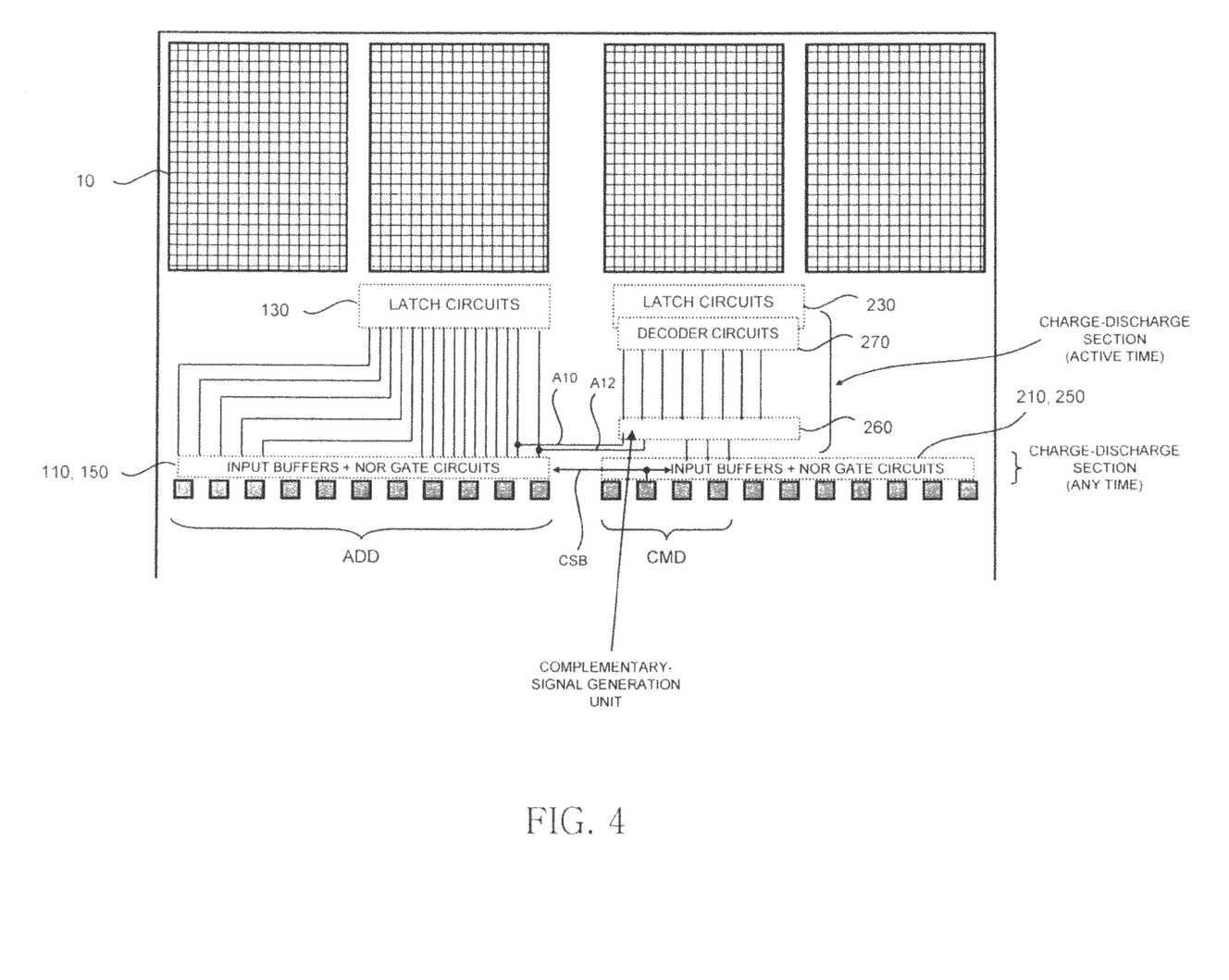
FIG. 4 is a schematic layout diagram of the address latch circuit shown in FIG. 2 and the command latch circuit shown in FIG. 3.

FIG. 4 is a schematic layout diagram of the address latch circuit 100 shown in FIG. 2 and the command latch circuit 200 shown in FIG. 3.

As shown in FIG. 4, a circuit portion configured by the input buffers 110 and the NOR gate circuits 150 is placed along the address terminal ADD. Likewise, a circuit portion configured by the input buffer 210 and the NOR gate circuits 250 is placed along the command terminal CMD. Thus, according to this layout, a section in which a charge and a discharge occur by clocking at a time of being inactive can be shortened greatly. However, when the chip select signal CSB becomes a low level (active), eight signal lines which connect the complementary-signal generation unit 260 and the decoder circuit 270 are all charged and discharged.

Figure 5:
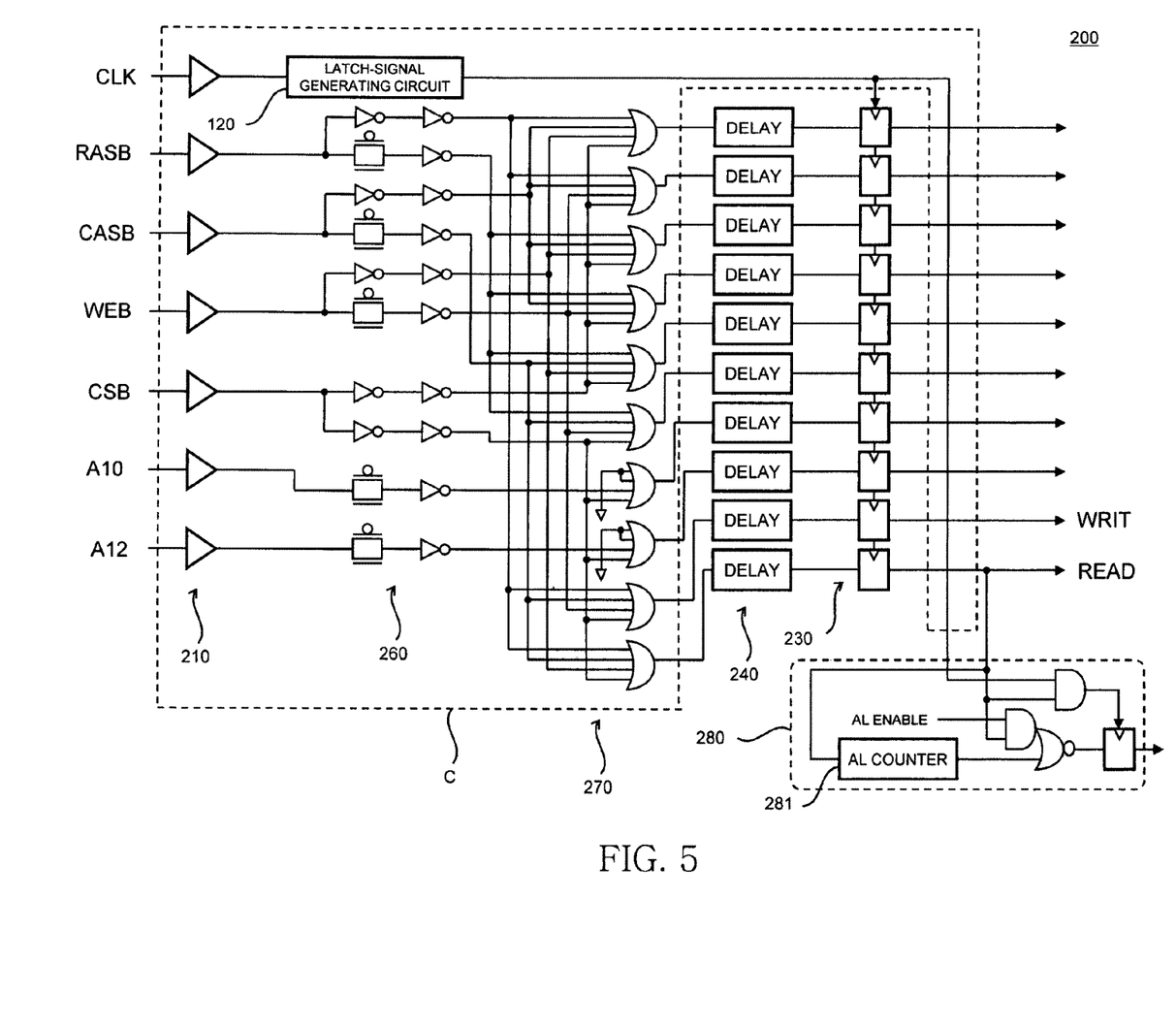
FIG. 5 is a circuit diagram showing another example of the command latch circuit included in the input circuit shown in FIG. 1.

FIG. 5 is a circuit diagram showing another example of the command latch circuit 200 included in the input circuit 12.

The command latch circuit 200 according to an example shown in FIG. 5 differs from the command latch circuit 200 according to the example shown in FIG. 3 in that between input buffers 210 and latch circuits 230, the complementary-signal generation units 260, the decoder circuits 270, and the delay circuits 240 are connected in this order. The other points are identical to those of the command latch circuit 200 shown in FIG. 3, and therefore like parts are designated by like reference numerals and redundant explanations thereof will be omitted.

In the command latch circuit 200 shown in FIG. 5, the decoder circuits 270 are each configured by a 4-input OR gate circuits, and the decoder circuits 270 are each supplied with the chip select signal CSB. Therefore, when the chip select signal CSB is a high level (inactive), all outputs of the respective decoder circuits 270 are fixed to a high level. Thereby, the section where a charge and a discharge occur by the change of the external signal is limited to a section C shown in FIG. 5, and the consumed power at a time of being inactive can be effectively reduced.

Therefore, in the example, a role of the NOR gate circuits 250 shown in FIG. 3 is provided by the decoder circuit 270, and thus, the NOR gate circuits 250 can be omitted. As a result, a skew adjustment required for the input to the NOR gate circuits 250 becomes unnecessary.

Further, ten signal lines which connect the decoder circuits 270 and the latch circuits 230 are each connected with the delay circuits 240. However, it is the decode signal that transmits this signal line, and thus, only 1 to 3 delay circuits 240 charge and discharge even at a time of being active. Accordingly, also the charge/discharge current at a time of being active can be reduced.

Figure 6:
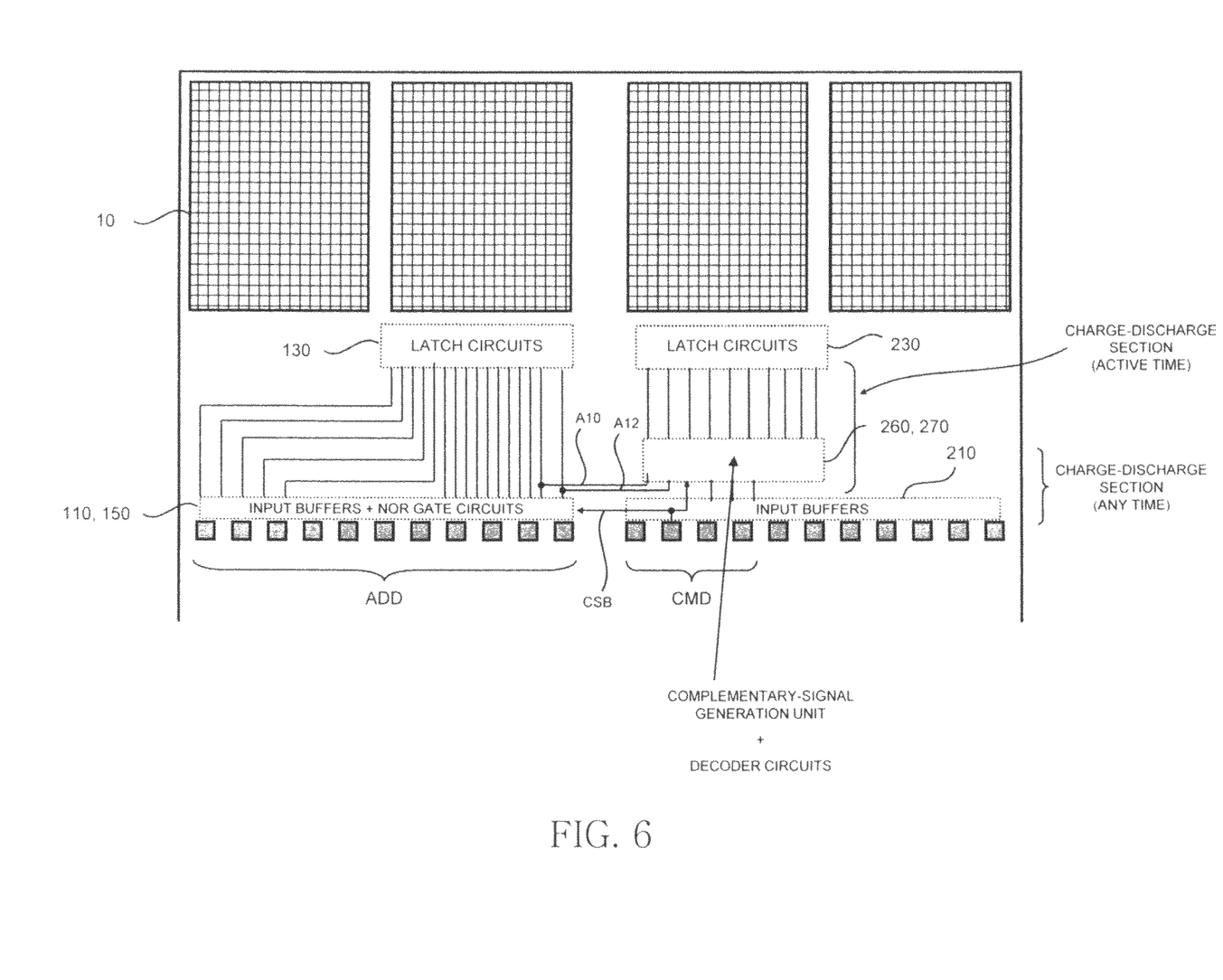
FIG. 6 is a schematic layout diagram of the address latch circuit shown in FIG. 2 and the command latch circuit shown in FIG. 5.

FIG. 6 is a schematic layout diagram of the address latch circuit 100 shown in FIG. 2 and the command latch circuit 200 shown in FIG. 5.

In an example shown in FIG. 6, the input buffer 210 is placed along the command terminal CMD, and in the vicinity thereof, a circuit portion configured by the complementary-signal generating unit 260 and the decoder circuit 270 is placed. Therefore, according to this layout, a section in which a charge and a discharge occur by clocking at a time of being inactive can be shortened greatly. Even when the chip select signal CSB becomes a low level (active) out of the ten signal lines which connect the decoder circuit 270 and the latch circuit 230, it is only up to three signal lines that charge and discharge. Thus, as compared to a wiring which connects the input buffer 210 and the complementary-signal generation unit 260, even when that which connects the decoder circuit 270 and the latch circuit 230 is longer, the charge/discharge current at a time of being active can be reduced.

Figure 7:
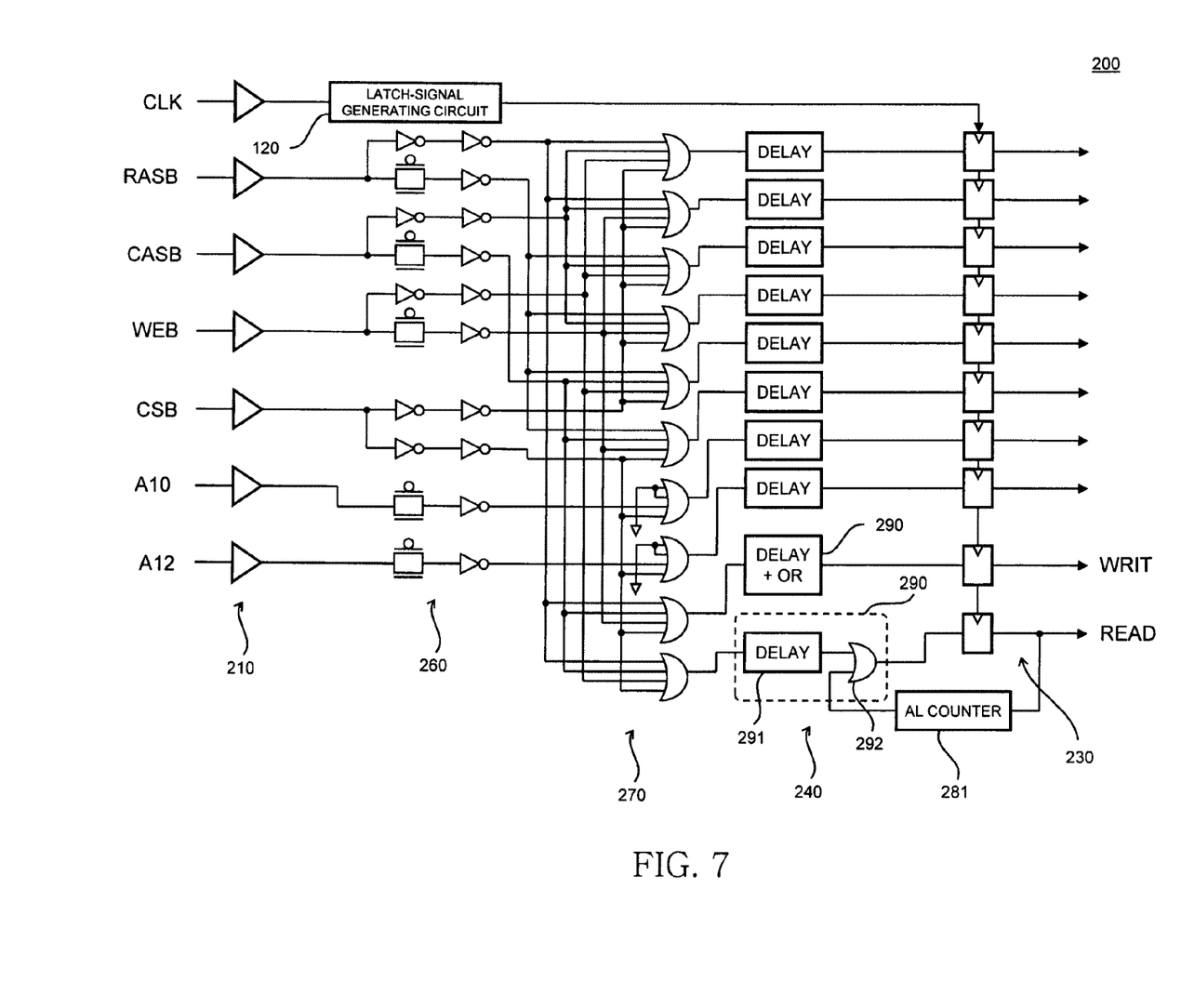
FIG. 7 is a circuit diagram showing still another example of the command latch circuit included in the input circuit shown in FIG. 1.

FIG. 7 is a circuit diagram showing still another example of the command latch circuit 200 included in the input circuit 12.

The command latch circuit 200 according to an example shown in FIG. 7 differs from the command latch circuit 200 according to the example showing in FIG. 5 in a configuration with respect to the additional latency circuits 280 shown in FIG. 5. The other points are identical to those of the command latch circuit 200 shown in FIG. 5, and therefore like parts are designated by like reference numerals and redundant explanations thereof will be omitted.

In the command latch circuit 200 shown in FIG. 7, corresponding to the read command and the write command, a delay circuit 290 with an OR gate is arranged. The delay circuit 290 with an OR gate is configured by: a delay circuit 291 that delays the read command or the write command; and an OR gate circuit 292 that receives output of the delay circuit 291 and output of the AL counter 281. As a result, the read command or the write command supplied via the decoder circuit 270, and the read command or the write command supplied via the AL counter 281 are synthesized by the OR gate circuit 292. That is, the delay circuit 290 works as a synthesizing circuit.

A delay amount of the delay circuit 290 with an OR gate in a route that passes through the delay circuit 291 is designed substantially equal to those of the other delay circuits 240. Thereby, the command latch circuit 200 according to the example can realize a function completely the same as that of the command latch circuit 200 shown in the FIG. 5.

In addition, in the example, it suffices that the latch circuits 230 required for the read command and for the write command are one each, and therefore a total of ten latch circuits 230 are sufficient. Thus, as compared to the command latch circuit 200 shown in the FIG. 5, the circuit scale can be reduced.

Figure 8:
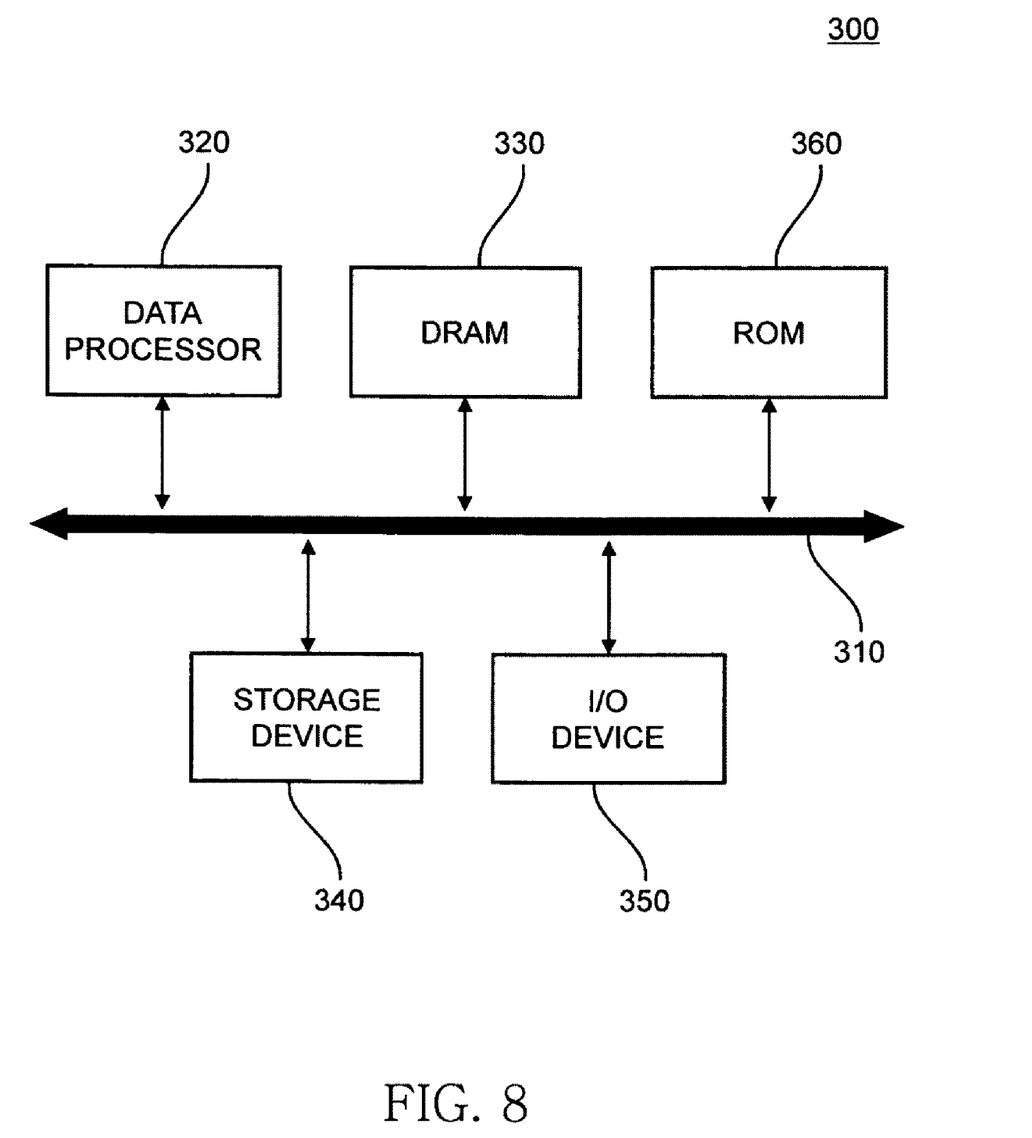
FIG. 8 is a block diagram showing a configuration of a data processing system using a semiconductor memory device according to a preferred embodiment of the present invention.

FIG. 8 is a block diagram showing a configuration of a data processing system 300 using a semiconductor memory device according to the present embodiment, and FIG. 8 shows a case that the semiconductor memory device is a DRAM.

The data processing system 300 shown in the FIG. 8 has a configuration such that a data processor 320 and a semiconductor memory device (DRAM) 330 are mutually connected via a system bus 310. Examples of the data processor 320 include but are not limited to a microprocessor (MPU) and a digital signal processor (DSP). In FIG. 8, for the sake of simplicity, the data processor 320 and the DRAM 330 are connected via the system bus 310; however, without intervention of the system bus 310, these components can be connected using a local bus.

In addition, in FIG. 8, for the sake of simplicity, only one set of the system bus 310 is shown. However, the system bus 310 can be arranged via a connector or the like, in series or in parallel, where appropriate. In a memory-system data processing system shown in FIG. 8, a storage device 340, an I/O device 350, and a ROM 360 are connected to the system bus 310. However, these components are not necessarily essential constituent components.

Examples of the storage device 340 can include a hard disk drive, an optical disk drive, and a flash memory. Examples of the I/O device 350 can include a display device such as a liquid crystal display, and an input device such as a keyboard and a mouse. Regarding the I/O device 350, even only one of an input device and an output device can suffice. For the sake of simplicity, each constituent element shown in FIG. 8 is shown by one. However, the number is not limited to one, and a plurality of one or two or more constituent elements can be arranged.

The present invention is in no way limited to the aforementioned embodiments, but rather various modifications are possible within the scope of the invention as recited in the claims, and naturally these modifications are included within the scope of the invention.

For example, in the address latch circuit 100 and the command latch circuit 200 shown in FIGS. 2 and 3, the NOR gate circuits 150 and 250 are used to stop clocking of the address signal and the command signal. However, a type of gate circuit is not limited to this. Likewise, the decoder circuit 270 does not have to be an OR gate circuit and other gate circuits such as an NAND gate can be used therefor.

The invention claimed is:

1. A semiconductor device comprising:
   first, second and third terminals respectively receiving first, second and third input signals from outside of the semiconductor device;
   first, second and third input buffers respectively coupled to the first, second and third terminals, the first, second and third input buffers producing first, second and third buffered signals responsive to the first, second and third input signals, respectively; and
   first and second gate circuits respectively coupled to the first and second input buffers, the first and second gate circuits coupled to the third input buffer in common, the first and second gate circuits respectively driving output nodes thereof in response to the first and second buffered signals when the third buffered signal is activated, and each of the first and second gate circuits holding the output nodes thereof at a fixed level irrelatively to the first and second buffered signals when the third buffered signal is inactivated.

2. The semiconductor device as claimed in claim 1, wherein the third terminal comprises a chip select terminal and the third signal comprises a chip select signal.

3. The semiconductor device as claimed in claim 2, wherein the first and second terminals respectively comprise first and second address terminals and the first and second input signals respectively comprise first and second address signals.

4. The semiconductor device as claimed in claim 2, wherein the first and second terminals respectively comprise first and second command terminals and the first and second input signals respectively comprise first and second external command signals.

5. The semiconductor device as claimed in claim 2, wherein the first terminal comprises an address terminal, the second terminal comprises a command terminal, the first input signal comprises an address signal, and the second input signal comprises a command signal.

6. The semiconductor device as claimed in claim 1, further comprising:
   first and second latch circuits; and
   first and second delay circuits provided between the first and second gate circuits and the first and second latch circuits, respectively.

7. The semiconductor device as claimed in claim 6, further comprising:
a clock terminal supplied with an external clock signal from outside of the semiconductor device;
a fourth input buffer coupled to the clock terminal to produce an internal clock signal responsive to the external clock signal; and
a latch-signal generating circuit coupled to the fourth input buffer to generate a latch signal based on the internal clock signal, and the first and second latch circuits latching signals from the first and second delay circuits in synchronism with the latch signal, respectively.

8. The semiconductor device as claimed in claim 4, wherein the first and second input buffers produce first and second buffered command signals responsive to the first and second external command signals, respectively, the first and second gate circuits comprise first and second command decoder circuits to produce first and second internal command signals responsive to the first and second buffered command signals, respectively.

9. The semiconductor device as claimed in claim 8, wherein the first internal command signal includes a read command signal to perform a read operation and the second internal command signal includes a write command signal to perform a write operation.

10. The semiconductor device as claimed in claim 8, further comprising first and second latch circuits coupled to the first and second gate circuits to latch the first and second internal command signals, respectively.

11. The semiconductor device as claimed in claim 10, further comprising first and second delay circuits provided between the first and second gate circuits and the first and second latch circuits to delay the first and second internal command signals, respectively.

12. A semiconductor device comprising:
a plurality of terminals arranged in line in a first direction;
a plurality of input buffers arranged in line in the first direction, each of the input buffers being allocated adjacently to an associated one of the terminals in a second direction perpendicular to the first direction to be coupled to the associated one of the terminals, and the input buffers including a first input buffer and second input buffers; and
a plurality of gate circuits arranged in line in the first direction, the gate circuits including first and second input nodes, respectively, each of the first nodes of the gate circuits being coupled to an associated one of the second buffers, and the second nodes of the gate circuits being coupled to the first input buffer in common.

13. A semiconductor device comprising:
a first terminal receiving from outside of the semiconductor device an external chip select signal;
a plurality of second terminals receiving a plurality of external input signals to be manipulated when the external chip select signal takes an active level;
a first input buffer coupled to the first terminal to produce a buffered chip select signal responsive to the external chip select signal;
a plurality of second input buffers coupled to the second terminals to produce a plurality of buffered input signals responsive to the external input signals, respectively;
a plurality of internal nodes; and
a gate circuit coupled to the first input buffer, the second input buffers and the internal nodes, the gate circuit driving the internal nodes in response to the buffered input signals when the buffered chip select signal takes a first level responsive to the active level of the external chip select signal and holding each of the internal nodes at a fixed level when the buffered chip select signal takes a second level responsive to an inactive level of the external chip select signal.

14. The semiconductor device as claimed in claim 13, wherein the second terminals include at least two command terminals, the external input signals including at least two external command signals supplied to the at least two command terminals, respectively, the buffered input signals including at least two buffered command signals responsive to the at least two external command signals, and the gate circuit including a command decoder circuit decoding the at least two buffered command signals to produce at least one internal command signal responsive to the at least two buffered command signals.

15. The semiconductor device as claimed in claim 14, wherein the at least one internal command signal includes a read command signal to perform a read operation on the semiconductor device.

16. The semiconductor device as claimed in claim 14, wherein the at least one internal command signal includes a write command signal to perform a write operation on the semiconductor device.

17. The semiconductor device as claimed in claim 13, further comprising a latch circuit, and a delay circuit coupled between the gate circuit and the latch circuit.

18. The semiconductor device as claimed in claim 17, further comprising:
a third terminal supplied with an external clock signal;
a third input buffer coupled to the third terminal to produce an internal clock signal responsive to the external chip select signal; and
a latch-signal generating circuit coupled to the third input buffer to generate a latch signal based on the internal clock signal, and the latch circuit latching signals from the delay circuits in synchronism with the latch signal.

19. The semiconductor device as claimed in claim 13, further comprising a delay circuit coupled to the gate circuit, a latch circuit, and a decoder circuit coupled between the delay circuit and the latch circuit.

20. The semiconductor device as claimed in claim 18, further comprising:
a third terminal supplied with an external clock signal;
a third input buffer coupled to the third terminal to produce art internal clock signal responsive to the external chip select signal; and
a latch-signal generating circuit coupled to the third input buffer to generate a latch signal based on the internal clock signal, and the latch circuit latching signals from the delay circuits in synchronism with the latch signal.

* * * * *